(12) United States Patent
Hoenk

(10) Patent No.: US 8,395,243 B2
(45) Date of Patent: Mar. 12, 2013

(54) SURFACE PASSIVATION BY QUANTUM EXCLUSION USING MULTIPLE LAYERS

(75) Inventor: Michael E. Hoenk, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 84 days.

(21) Appl. No.: 13/160,534

(22) Filed: Jun. 15, 2011

(65) Prior Publication Data

US 2011/0304022 A1    Dec. 15, 2011

Related U.S. Application Data

(60) Provisional application No. 61/355,049, filed on Jun. 15, 2010.

(51) Int. Cl.
    *H01L 23/58*    (2006.01)
(52) U.S. Cl. ............. 257/629; 257/635; 257/E29.001

(58) Field of Classification Search .................. 257/627, 257/628, 629, 635, 636, E29.001
See application file for complete search history.

(56) References Cited

U.S. PATENT DOCUMENTS 7,179,746 B2 *    2/2007    Ohmi et al. .................. 438/697

\* cited by examiner

*Primary Examiner* — Hoai V Pham
(74) *Attorney, Agent, or Firm* — Milstein Zhang & Wu LLC; Joseph B. Milstein

(57) ABSTRACT

A semiconductor device has a multilayer doping to provide improved passivation by quantum exclusion. The multilayer doping includes a plurality M of doped layers, where M is an integer greater than 1. The dopant sheet densities in the M doped layers need not be the same, but in principle can be selected to be the same sheet densities or to be different sheet densities. M−1 interleaved layers provided between the M doped layers are not deliberately doped (also referred to as "undoped layers"). Structures with M=2, M=3 and M=4 have been demonstrated and exhibit improved passivation.

6 Claims, 11 Drawing Sheets

SURFACE PASSIVATION BY QUANTUM EXCLUSION USING MULTIPLE LAYERS

CROSS-REFERENCE TO RELATED APPLICATIONS

This application claims priority to and the benefit of U.S. provisional patent application Ser. No. 61/355,049, filed Jun. 15, 2010, which application is incorporated herein by reference in its entirety. This application is also related to U.S. patent application Ser. No. 12/965,790, filed Dec. 12, 2010, which is assigned to the same assignee as the present application.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The invention relates to semiconductor devices in general and particularly to silicon devices that rely on surface passivation for their operation.

BACKGROUND OF THE INVENTION

Statement of the Problem

Surface Passivation, Quantum Efficiency, and Stability of Back-Illuminated Imaging Detectors Surfaces and interfaces have long been known to be critical to the performance of virtually all solid-state devices, and imaging devices in particular. Surface passivation technologies were critical to both the invention of the transistor and to the development of reliable processes for planar integrated circuits, which launched the semiconductor revolution. The revolution in solid-state imaging devices began in 1969, with the invention of charge-coupled devices (CCDs). Surfaces and interfaces posed problems from the beginning, and many of the later improvements in CCD design were directed toward achieving control over the quality of interfaces near the device's front surface. Texas Instruments demonstrated the first back-illuminated CCDs as early as 1974.

NASA quickly realized the potential for solid-state imaging devices for astronomical imaging in space, and began developing CCDs and cameras for space instruments, including the Hubble Space Telescope. The Jet Propulsion Laboratory (JPL) played a key role in this development. JPL was responsible for developing the Wide Field/Planetary Camera (WF/PC), an important instrument for the Hubble Space Telescope (HST) which would later produce the iconic images associated with NASA and the HST. One of the most important science requirements for WF/PC detectors was the achievement of high quantum efficiency (QE) over a wide spectral range with photometric stability better than 1%. In particular, the HST detectors were required to detect UV light down to the Lyman-$\alpha$ line of atomic hydrogen, situated in the far ultraviolet region of the spectrum, at a wavelength of 121.6 nm. As evidenced by the history of WF/PC II, between quantum efficiency and stability, stability is the more important detector performance specification.

In order to meet these requirements, back illumination was considered essential, because absorption in the front-surface gate electronics of CCDs rendered conventional, front-illuminated CCDs virtually blind in the ultraviolet. Unfortunately, back illumination led to instabilities in the response, as the substrate removal process necessary to expose the light-sensitive volume of the detector was found to create an unstable back surface of the CCD. Because of the low doping levels and high density of unpassivated defects in the surface, changes in the environment affected the response of thinned detectors. In particular, the back surface potential at the Si—$SiO_2$ interface, which is critical for high efficiency collection of photogenerated charge, depends on both the physical environment and the illumination history of the device. Early efforts to control the back surface potential were based on optimizing the thinning process to leave a thin p+ layer on the back surface of the CCD. This approach proved inadequate, as poor uniformity of thinning, low surface dopant concentrations, and lack of control over the dopant profile presented insurmountable barriers to achieving the required stability. This problem came to a head when the WF/PC instrument was undergoing thermal-vacuum testing in advance of the originally planned December 1984 launch date. The WF/PC detectors exhibited quantum efficiency hysteresis (QEH) over an order of magnitude worse than the 1% stability specification set by HST's science requirements. To better address this problem for HST and future instruments, JPL began a concerted effort to solve the back-surface passivation problem, which would encompass the development of a UV-flood process, the deposition of high work function metals to act as Schottky barriers, and the use of a biased back-surface contact. While none of these approaches succeeded in time for WF/PC (launched in 1990) and WF/PC II (launched in 1992), these technologies evolved into the modern state-of-the-art technologies of chemisorption passivation (Lesser et al.) and shallow ion-implantation followed by a laser anneal. Nevertheless, even in their modern incarnations, state-of-the-art surface passivation technologies have not solved all of the problems raised by HST detector development in the 1980's.

A discussion of some of the prior art methods is given hereinbelow. In particular, one of the best methods of passivating surfaces in silicon devices known in the prior art is referred to as delta doping.

Known in the prior art is Hoenk et al., U.S. Pat. No. 5,376,810, issued Dec. 27, 1994, which is said to disclose a backside surface potential well of a backside-illuminated CCD that is confined to within about half a nanometer of the surface by using molecular beam epitaxy (MBE) to grow a delta-doped silicon layer on the back surface. Delta-doping in an MBE process is achieved by temporarily interrupting the evaporated silicon source during MBE growth without interrupting the evaporated p+ dopant source (e.g., boron). This produces an extremely sharp dopant profile in which the dopant is confined to only a few atomic layers, creating an electric field high enough to confine the backside surface potential well to within half a nanometer of the surface. Because the probability of UV-generated electrons being trapped by such a narrow potential well is low, the internal quantum efficiency of the CCD is nearly 100% throughout the UV wavelength range. Furthermore, the quantum efficiency is quite stable.

Also known in the prior art is Cunningham et al., U.S. Pat. No. 6,107,619, issued Aug. 22, 2000, and Cunningham et al., U.S. Pat. No. 6,346,700, issued Feb. 12, 2002, both of which are said to disclose a delta-doped hybrid advanced detector (HAD) is provided which combines at least four types of technologies to create a detector for energetic particles ranging in energy from hundreds of electron volts (eV) to beyond several million eV. The detector is sensitive to photons from visible light to X-rays. The detector is highly energy-sensitive from approximately 10 keV down to hundreds of eV. The detector operates with milliwatt power dissipation, and allows non-sequential readout of the array, enabling various advanced readout schemes.

Also known in the prior art is Nikzad et al., U.S. Pat. No. 7,786,421, issued Aug. 31, 2010, which is said to disclose a system and method for making solid-state curved focal plane arrays from standard and high-purity devices that may be matched to a given optical system. There are two ways to make a curved focal plane arrays starting with the fully fabricated device. One way, is to thin the device and conform it to a curvature. A second way, is to back-illuminate a thick device without making a thinned membrane. The thick device is a special class of devices; for example devices fabricated with high purity silicon. One surface of the device (the non VLSI fabricated surface, also referred to as the back surface) can be polished to form a curved surface.

Also known in the prior art is Blacksberg et al., U.S. Pat. No. 7,800,040, issued Sep. 21, 2010, which is said to disclose a method for growing a back surface contact on an imaging detector used in conjunction with back illumination. In operation, an imaging detector is provided. Additionally, a back surface contact (e.g. a delta-doped layer, etc.) is grown on the imaging detector utilizing a process that is performed at a temperature less than 450 degrees Celsius.

There is a need for systems and methods that provide improved passivation of semiconductor devices.

SUMMARY OF THE INVENTION

According to one aspect, the invention features a silicon device, comprising a silicon wafer bounded by a first surface and a second opposite the first surface, the silicon wafer having a device fabricated on one of the first surface and the second surface; the silicon wafer having a doping profile situated adjacent at least one of the first surface and the second surface, the doping profile having a plurality M of doped layers; each of plurality M of doped layers having a thickness of less than 10 Angstroms, and a dopant sheet density at least $10^{14}$ cm$^{-2}$, where M is an integer greater than 1; the plurality M of doped layers separated from each other by M−1 interleaved layers of silicon, at least one of the M−1 interleaved layers of silicon having a thickness in the range of 10 Angstroms to 30 Angstroms; the silicon wafer having at least one of the first surface and the second surface electronically passivated irrespective of a density of defects present on the respective one of first surface and the second surface.

In one embodiment, M is at least 3, and the plurality M of doped layers are separated by M−1 interleaved layers of silicon, at least two of the M−1 interleaved layers of silicon having substantially equal thicknesses.

In another embodiment, M is at least 3, and the plurality M of doped layers are separated by M−1 interleaved layers of silicon, at least two of the M−1 interleaved layers of silicon having unequal thicknesses.

In yet another embodiment, at least one of the M−1 interleaved layers of silicon has a dopant sheet density of less than $10^{13}$ cm$^{-2}$.

In still a further embodiment, a dopant gradient of at least one decade per nm exists between one of the plurality M of doped layers and an adjacent one of the M−1 interleaved layers of silicon.

According to another aspect, the invention relates to a silicon device, comprising a silicon wafer bounded by a first surface and a second opposite the first surface, the silicon wafer having a device fabricated on one of the first surface and the second surface; the silicon wafer having a doping profile situated adjacent at least one of the first surface and the second surface, the doping profile having a plurality M of doped layers; each of plurality M of doped layers having a thickness of less than 40 Angstroms, a dopant sheet density at least $10^{14}$ cm$^{-2}$ and a dopant gradient of at least one decade per nm, where M is an integer greater than 1; the silicon wafer having at least one of the first surface and the second surface electronically passivated irrespective of a density of defects present on the respective one of first surface and the second surface.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

In FIG. 8, the near surface hole density for the heavy hole band is calculated based on trapping of holes at the surface. Hole trapping significantly reduces the density of holes for the delta-doped surface, the potential barrier between surface and detector for the delta-doped surface, but has a relatively minor effect on the hole density created by multilayer doping. Curve 810 represents calculated data for a single delta doped layer, curve 820 represents calculated data for a multilayer having two doped layers, and curve 830 represents calculated data for a multilayer having four doped layers.

DETAILED DESCRIPTION

Prior Art Surface Passivation Technologies

Chemisorptioin Charging

Figure 1:
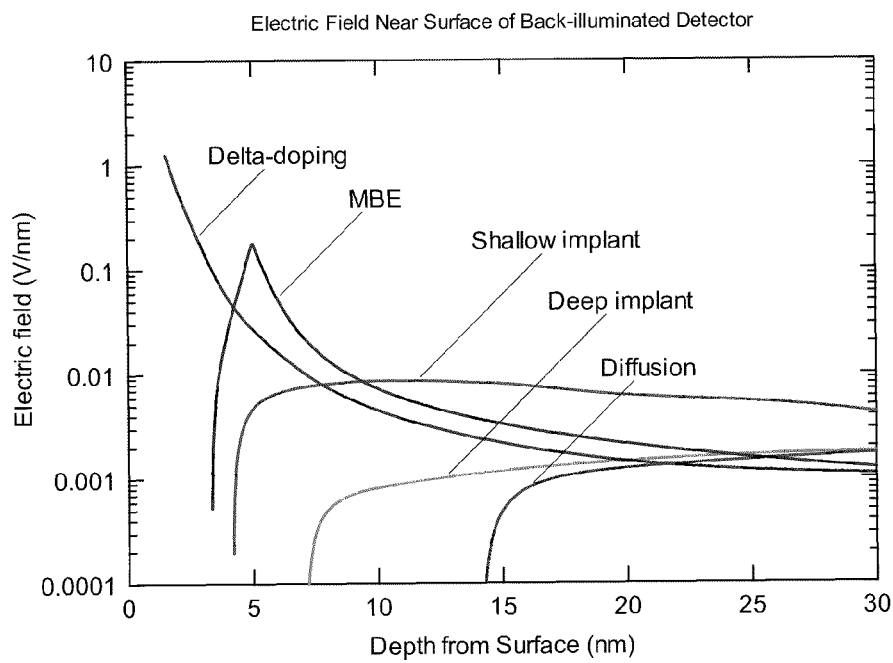
FIG. 1 is a diagram that illustrates calculated electric fields comparing delta-doped surfaces to other methods of surface doping in the prior art.

Chemisorption passivation in its modern form evolved from early efforts at JPL to use high work function metals to form a Schottky barrier on the back surface of thinned CCDs. A Schottky barrier exists due to charge transfer across an interface between dissimilar materials. The rationale behind using Platinum to form the Schottky barrier was that the high work function of Platinum would create a near surface electric field of the right polarity in the silicon surface to drive photogenerated electrons away from the back surface and toward the front-surface detector electronics (in fact this is a general requirement that applies to all of the various surface passivation technologies for imaging detectors). In the course of JPL's development of sensors for WF/PC II, it was discovered that the surface charging mechanism responsible for improving the detector quantum efficiency with the Pt "flash gate" technology was not (as originally intended and expected) the formation of a Schottky barrier at the surface, but instead involved the accumulation of negatively charged O$_2^-$ ions on the oxide surface through a chemisorption process. Thus a similar charging mechanism underlay both the earlier UV flood process and the Pt "flash gate"; unfortunately, neither of these processes provided adequate stability, nor did subsequent improvements and refinements successfully resolve the surface passivation problem. A key part of the difficulty lay with the oxide. The stability of chemisorbed charge was found to be critically dependent on the quality and thickness of the oxide. The formation of a high quality thermal oxide required temperatures that exceeded the tolerance of imaging detectors, so a low temperature "flash oxide" process was developed based on exposing the surface to steam at moderate temperatures. Unfortunately, the "flash oxide" failed to stabilize the device, as changing environmental conditions (especially with respect to exposure to hydrogen) could reverse the polarity of the chemisorbed charge with a catastrophic effect on detector quantum efficiency and spectral response. As a result of these limitations, development of the Pt "flash gate" was abandoned, and was not used in detectors flown on WF/PC II.

Subsequent development efforts at the University of Arizona led to several innovations and refinements of the chemisorption process, including the use of thicker, higher quality oxide layers, switching to metals that aren't sensitive to poisoning by hydrogen exposure, and coating the metal layer with thermally deposited $HfO_2$ dielectric layer to stabilize the chemisorbed charge against environmental variations. Chemisorption devices have been used in both ground and space-based observatories. Despite these advances, surface passivation by chemisorption charging is limited to visible and near ultraviolet wavelengths by absorption in the dielectric layers required to hold and stabilize chemisorbed charge. Chemisorption charging is also subject to irreversible damage by ionizing radiation. In particular, chemisorption is unstable to the ionizing effects of deep ultraviolet light, which is well known to liberate H+ ions and create traps in $SiO_2$ and other dielectric layers used as insulating layers in the semiconductor industry. Finally, chemisorption creates fixed charge embedded in an insulating layer, and does not provide a conductive path in the silicon for lateral transport of photo-generated majority carriers. The requirement for a conductive back surface has been found to be important in applications requiring fully-depleted imaging devices and is likely to be important in applications that require exposure to high intensity light sources, such as deep ultraviolet lasers.

Ion Implantation and Laser Anneal

Ion implantation is a standard process used in the semiconductor industry to selectively dope semiconductor surfaces for device applications. The process is based on directing energetic dopant atoms toward a semiconductor surface to implant a desired dose in the crystal lattice. The implanted atoms are not located on electrically active lattice sites of the crystal, and the implantation process creates a high density of defects that degrade the quality of the semiconductor. Implantation therefore requires a high temperature thermal process to anneal away many of the crystal defects and to electrically "activate" the implanted atoms by allowing a fraction of the atoms to move from interstitial sites into crystal lattice sites. However, the temperature required for "activation" is incompatible with the thermal constraints of device processing (note that there are isolated exceptions, in which refractory metals are used in the front-surface electronics in order to enable high-temperature furnace anneals of ion-implanted layers; however, refractory metals require specialized processes and impose constraints on metal conductivity that are not compatible with all imaging device technologies and applications). Therefore, in order to adapt ion implantation to the requirements and constraints of imaging detectors, several process modifications are important. First, very low energy implantation is desired in order to create shallow dopant profiles suitable for detection into the UV range. Second, a very shallow annealing process is implanted using pulsed lasers to heat only the near-surface region. Third, as opposed to selective processes used to dope small areas in transistors and other devices, ion implantation of back-illuminated imaging detectors requires that processes be optimized to achieve uniform doping over the entire detector surface. This is particularly challenging for laser annealing, which tends to create "brick wall" artifacts in imaging detectors.

Ion implantation provides higher dopant concentrations and more control over the incorporated dopant profile than the diffusion-related profiles that were originally used in the optimal thinning process for WF/PC detectors. However, this is only a relative advantage, as the physics of ion implantation and the necessity of maintaining process compatibility with imaging detectors provide only limited flexibility in designing the shape, depth, peak position, amplitude, and uniformity of the dopant profile. These constraints in turn place limits on the ability to use ion implantation for optimization of detector performance, especially with regard to UV quantum efficiency, defect-related dark current generation, and "deep depletion" for improved spatial resolution. In particular, ion implantation cannot create abrupt dopant profiles, which (as we shall see) are extremely important for surface passivation.

The inability of ion implantation/anneal processes to create abrupt dopant profiles is a limitation that extends beyond the field of imaging detector technologies. Achieving abrupt dopant profiles is one of the major challenges faced by the semiconductor industry in its ongoing efforts to fabricate integrated circuits with higher densities. The goal of creating sharper ion-implanted dopant profiles is the subject of an extensive literature in semiconductor processing journals. One of the limitations lies with broadening of implanted dopant distributions during the annealing process. The phenomenon of transient enhanced diffusion (TED) refers to the anomalously high diffusion rates observed during the annealing of implanted dopant distributions. The observed high rates of diffusion are related to defects inevitably created by the implantation process.

Despite these limitations, ion-implanted imaging devices are currently being used in a wide variety of imaging applications, including scientific imaging detectors deployed in space. State-of-the-art ion-implanted devices are at the heart of the Wide-Field Camera 3 (WFC3) instrument, which recently replaced the Wide Field/Planetary Camera 2 instrument on the Hubble Space Telescope. However, despite significant advances in the two decades following the development of WF/PC 2 detectors, the state-of-the-art ion-implanted devices in WFC3 still exhibit quantum efficiency hysteresis (QEH) that is outside the HST specifications. Based on extensive characterization of these devices, the observed QEH appears to be related to charge traps in the silicon, which are probably an artifact inherent in the ion implantation/anneal process used for back surface passivation. The temporary solution that is currently in use for WFC3 is a periodic exposure of the device to intense light, in order to fill these traps; maintaining the detector at a low operating temperature stabilizes the trapped charge sufficiently to collect scientific data.

Delta Doping

At the same time that detector development for WF/PC 2 was underway, JPL scientists began developing a unique surface passivation technology based on the epitaxial growth of highly-doped silicon. Whereas conventional crystal growth technologies require temperatures that exceed the tolerance of CCDs, JPL had conducted pioneering work in the 1980's on a low temperature molecular beam epitaxy process that could achieve epitaxial growth of silicon at CCD-compatible temperatures (below 450° C.). These efforts led to the development and demonstration of delta-doped CCDs in 1992, in which low temperature MBE growth was used to form an ultrathin, delta-doped silicon layer on a fully-functional, thinned CCD.

The delta-doping process derives its name from a dopant profile that resembles the mathematical delta function. Delta-doping achieves an exceptionally abrupt dopant profile by interrupting the flux of silicon atoms, depositing dopant atoms at a density of about one third of a monolayer (approximately $2\times10^{14}$ dopant atoms/cm$^2$), and encapsulating the dopant atoms by growing a 1-2 nm silicon "cap" layer. Because the dopants are incorporated in a growth process, MBE-grown layers do not suffer from the defects created by lattice damage during ion implantation, nor do they require a high temperature annealing process that would limit the ability to generate abrupt dopant profiles. The process of interrupting and then restarting the silicon flux during growth concentrates the dopant atoms in a layer that is only a few atomic layers thick, which can be precisely located within a few atomic layers of the surface. This precision is the ultimate in abrupt doping profiles and cannot be achieved by ion implantation or any other conventional doping process (e.g., ion implantation and diffusion).

Delta-doping achieves nearly 100% internal quantum efficiency through the far and extreme ultraviolet spectral range, with no apparent degradation in performance from exposure to ionizing radiation, no measurable quantum efficiency hysteresis and no apparent sensitivity to environmental conditions even after several years of storage at room temperature in the presence of oxygen and water vapor. Whereas delta-doping was initially demonstrated using elemental boron as a dopant material for surface passivation of thin, n-channel CCDs, subsequent development efforts have shown that delta-doping works equally well for surface passivation of back-illuminated photodiode arrays, CMOS imaging arrays, fully-depleted p-channel CCDs (requiring n-type delta-doping using antimony as the dopant material), and electron-multiplied CCDs (which use a high-gain output register for photon-counting applications).

MBE Doping Using a Uniform Dopant Profile

MIT Lincoln Labs (MIT-LL) has recently developed a surface passivation process that uses an MBE-grown silicon layer that is 5 nm in thickness and contains a uniform distribution of boron (B) at a concentration of $2\times10^{20}$ cm$^{-3}$ (corresponding to a sheet density of $1\times10^{14}$ cm$^{-2}$). MIT-LL claims the achievement of near 100% internal quantum efficiency and no measurable hysteresis. Studies done by MIT-LL on exposure of back-illuminated CCDs to extreme ultraviolet radiation prove that the MBE-grown layer is more radiation hard than either chemisorption charging or ion implantation. The improved hardness to radiation of MBE-passivated devices is attributed to the total amount of charge incorporated into the passivation layers and the relative thickness of the oxide layers on the surfaces. Citing greater mobility of electrons than holes injected into oxides by ionizing radiation, the authors of the study assert that exposure to radiation produces positive charge in the oxide layer that compensates dopants in the surface passivation layer. Of the devices compared in this study (which did not include a delta-doped device), the uniform, MBE-grown passivation layer contains the greatest charge density ($1\times10^{14}$ cm$^{-2}$), and the thinnest oxide (1-2 nm). Compared to uniformly doped layers grown by MIT-LL, JPL's delta-doping process achieves higher charge densities with thinner MBE-grown layers, and the multilayer passivation layer described here achieves even higher charge densities.

In a related study, researchers at MIT-LL found that the MBE-grown layer is responsible for excess surface-generated dark current. They were able to mitigate this problem with a 400° C. anneal in hydrogen, which passivates surface states in the native oxide and thereby reduces the surface-generated dark current. Even with the incorporation of hydrogen passivation, the observed dark current is still an order of magnitude higher than an equivalent front-illuminated device, indicating that back-surface defects are not fully passivated. JPL's delta-doping process does not require hydrogen passivation to achieve low dark current.

Limitations of Delta-Doping and the Need for a New Technology

Figure 2:
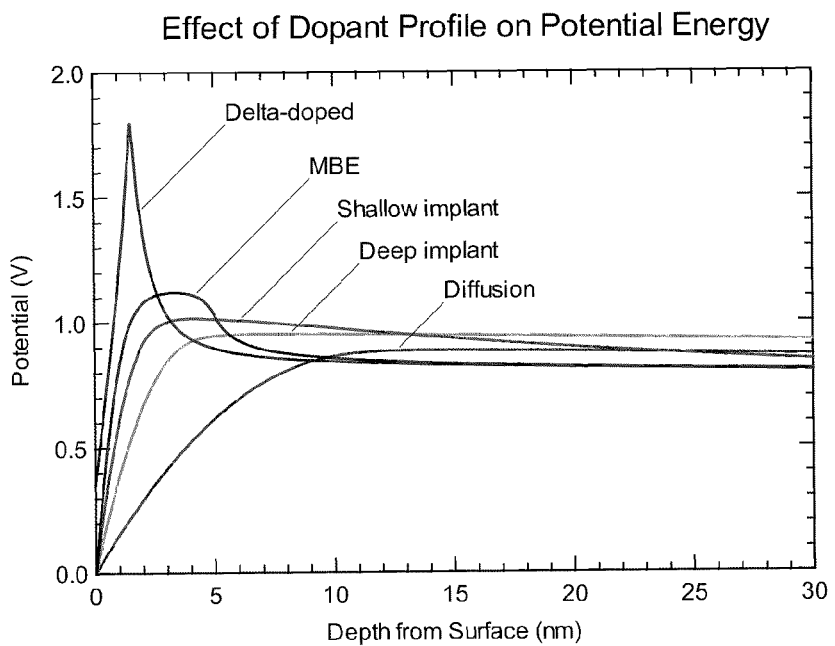
FIG. 2 is a diagram that illustrates calculated electric potentials comparing delta-doped surfaces to other methods of surface doping in the prior art.
Figure 3:
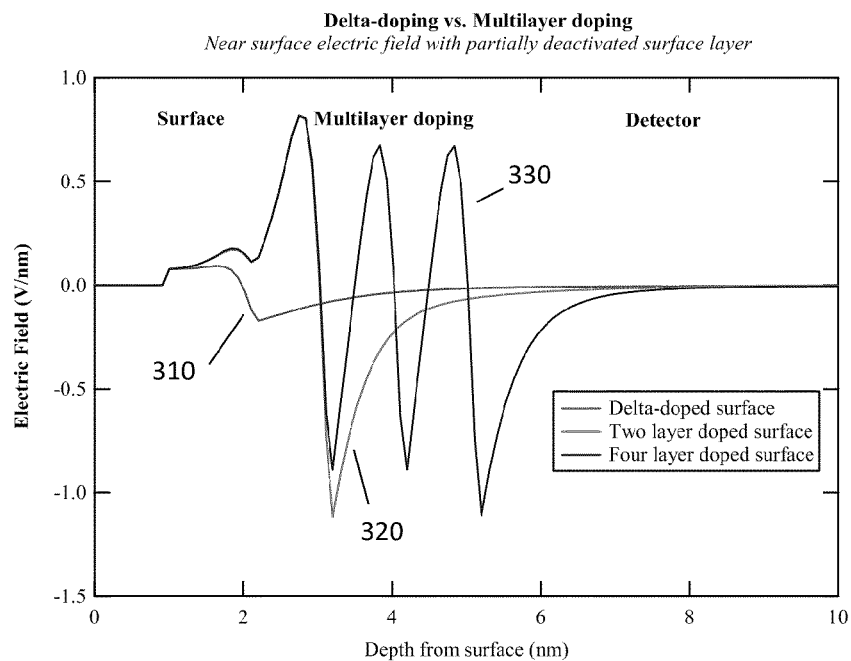
FIG. 3 is a diagram that illustrates near surface electric field. All MBE layers represented in the figure contain a surface dipole region and a silicon bulk region, where electric fields are very high. Multilayer (also referred to as "multiple layer'") doping creates a third region in the surface which is absent in the delta-doped surface. In this region, the electric fields are also very high, but the average field is relatively low. Curve 310 represents calculated data for a single delta doped layer, curve 320 represents calculated data for a multilayer having two doped layers, and curve 330 represents calculated data for a multilayer having four doped layers.

FIGS. 1 and 2 compare delta-doping with other surface doping technologies according to calculated near-surface electric fields and electronic potentials. The slowly varying dopant profiles created by diffusion and ion implantation produce weak, slowly varying electric fields and potentials, which provides poor isolation of surface from bulk and leads to instabilities in the response (as seen in the WFC3 detector performance data from the Hubble Space Telescope). In comparison, the plots show that delta-doping creates the strongest electric fields and the highest energy barriers of any surface passivation technology in the prior art. This is consistent with quantum efficiency and stability measurements that show how effective a passivation layer delta-doping provides. Nevertheless, recent measurements suggest that the surface density of mobile holes is two orders of magnitude lower than the surface density of dopant atoms in the delta-doped layer. This discrepancy is significant, both for its consequences for device performance, and for its implication that an improved surface passivation technology is necessary. The inventive technology addresses this need, as described below.

FIG. 1 is a diagram that illustrates calculated electric fields comparing delta-doped surfaces to other methods of surface doping in the prior art.

FIG. 2 is a diagram that illustrates calculated electric potentials comparing delta-doped surfaces to other methods of surface doping in the prior art.

State-of-the-art passivation technologies in the prior art: These two plots present results of calculations that were done to compare delta-doping with other surface doping technologies in the prior art. The plots show that delta-doping creates the strongest electric field and the highest energy barrier of any prior art. The key to achieving this is the creation of abrupt dopant profiles by MBE. Whereas the principles illustrated by these models are correct, recent results suggest the existence of chemical and/or physical mechanisms that cause the behavior of real delta-doped surfaces to deviate from the models.

Surface Passivation by Quantum Exclusion

Multilayer Doping: Introduction and General Description

Various methods of surface passivation technologies are well known in the art that predate the technologies specifically developed for back-illuminated detectors (as well as solar cells, which have very similar requirements as detectors). These well-known technologies include the growth of thermal oxides, annealing in hydrogen, and the growth or deposition of high performance insulators (e.g., high-k oxides that are the subject of a large literature in semiconductor technology). These technologies are directed toward eliminating or mitigating the influence of electrically active defects, as opposed to charging the surface to create favorable fields and potentials. With the exception of delta-doping, all of the surface charging methods described in the previous section also rely on such methods—especially hydrogen passivation—to help improve stability and efficiency of surface passivation. This reliance on low defect densities presents a problem for stability, because ionizing radiation—including exposure to high energy photons (e.g., deep ultraviolet, far ultraviolet, and extreme ultraviolet light, all of which are technologically and scientifically important). One of the advantages of the inventive technology is the improvement of stability irrespective of surface defects.

Stability is an important performance metric, as charging and discharging of surfaces and interfaces can play havoc with devices. As illustrated by the history of detector development for the Hubble Space Telescope, back-illuminated optical detectors require surface passivation in order to achieve high quantum efficiency, low dark current and stable response. Passivation requires a process to create a passivation layer which is thin enough to be transparent at all detected wavelengths. For optimal efficiency, the passivation layer must create a strong electric field in the silicon near the detector surface in order to prevent minority carriers from recombining or becoming trapped at the surface. To suppress surface-generated dark current, the passivation process must either eliminate surface states or suppress the injection of thermally-generated charge from the surface into the bulk silicon. In order to mitigate quantum efficiency hysteresis, the fields created by the passivation layer must be stable against perturbations of the surface potential, which may be caused by trapping and detrapping of electrons and holes at the surface. Surface passivation technologies are also distinguished by robustness, or the ability to reduce or delay degradation of detector performance in a harsh environment (e.g., mitigating or preventing permanent changes to the detector performance that may accompany chemical or physical damage to the surface due to contaminants and/or ionizing radiation). Recent data from the Wide Field Camera 3 instrument on the Hubble Space Telescope, as well the need for improved lifetime in DUV, FUV and EUV detectors, demonstrates that there is a need for surface passivation technologies with improved stability and robustness.

The inventive technology achieves improved stability and robustness compared to the prior art by using multilayer doping to achieve exceptionally high density of dopant in a thin passivation layer, thus isolating the detector from the surface irrespective of the density of surface defects. The design and implementation of the inventive technology requires nanometer-scale control over the semiconductor composition. On this length scale, electron and hole interactions with the surface are governed by quantum mechanics, and the isolation of surface from bulk is achieved through control of the quantum behavior of electrons and holes—hence the terminology, surface passivation by quantum exclusion.

The multilayer doping technology improves the performance of solid-state detectors compared to the prior art in the following ways:

It provides a tunneling barrier that suppresses the generation and transport of minority carriers from surface to bulk (thereby improving stability and improving signal-to-noise performance by reducing the sensitivity to surface states).

It provides a tunneling barrier that suppresses the transport of low-energy ("thermal") minority carriers from the bulk silicon to the surface, and reduces the probability of such carriers from interacting with traps at the surface (enabling high quantum efficiency and improving stability).

It minimizes the probability of trapping or recombination of high-energy ("hot") minority carriers either at the surface or within the passivation layer, and (conversely) promotes the transport of such carriers away from the surface and into the bulk silicon (enabling high quantum efficiency and improving stability and robustness).

It provides high surface conductivity in order to facilitate lateral transport of excess majority carriers, thus mitigating local accumulation of majority carriers and helping to maintain the detector surface at a constant potential under all illumination conditions (improving stability by mitigating dynamic charging of surface states).

It isolates the fields and potentials in the bulk silicon from being influenced by temporary or permanent changes in the surface potential, thus mitigating any effects on detector performance caused by chemical and physical changes to the surface and oxide/antireflection-coating (e.g., due to radiation damage, hot carrier injection, or other damaging effects of the environment).

The principles, methods, and structures for achieving surface passivation by quantum exclusion using multilayer doping are described below.

Multilayer doping interposes a thin crystal between the surface and silicon detector that is transparent to high-energy ("hot") carriers and opaque to low energy (thermal) carriers. Effectively, multilayer doping creates an electronic surface that is isolated from and independent of the physical surface. The layer itself is designed according to the principles of quantum mechanics to isolate and decouple surface states/defects from minority carrier states in the detector (semiconductor "bulk"), while minimizing the probability that hot carriers will be captured within the layer or at the surface. As described above, this quantum mechanical decoupling of the electronic and physical surfaces (quantum exclusion) is extremely important in imaging detectors, because of the requirement to prevent environmental conditions (chemical or physical changes to surface coatings, adsorbed or chemisorbed molecules, and external fields) from affecting the performance of the imaging detector (especially sensitivity, stability, and noise).

Whereas the context of this invention is the field of imaging detectors, virtually all semiconductor devices are affected by defects in surfaces and interfaces. It is stipulated that the concept of surface passivation by quantum exclusion is more general both in method and application; that other methods of creating the required near-surface electronic potential required for passivation can be developed based on these concepts; and that passivation by quantum exclusion may find useful application in a larger class of semiconductor devices and applications than the above-cited examples of solar cells, photodetectors, and back-illuminated solid-state imaging devices.

While the preferred implementation is passivation of silicon surfaces using MBE growth of doped silicon layers, it is further stipulated that various engineered materials may be designed and fabricated to implement surface passivation by quantum exclusion in various materials systems, including silicon, alloys containing silicon germanium, and a variety of III-V and II-VI semiconductor materials, all of which can be grown and doped with nanometer-scale precision using the methods of molecular beam epitaxy. Other materials systems and fabrication technologies (such as organic semiconductors) may also be amenable to the methods and concepts applied here.

The ideas and methods presented here can be generalized to encompass many more device structures and technologies. Epitaxial growth technology, together with the theory and concepts of surface passivation by quantum exclusion, are readily extendable to more complicated structures and functions, especially with respect to two and three dimensional patterned structures. The ability to fabricate semiconductor dopant profiles with nearly atomic-scale precision enables the manipulation of quantum mechanical states and quantum transport of electrons and holes. These technologies can thus be applied in the design, modification, and development of many conceivable device structures, seeking either optimal performance or reduced dimensions of existing devices (such as the transistors used as building blocks of integrated circuits) or in developing novel devices and structures that require improved surfaces for their practical realization.

The remainder of this disclosure focuses on multilayer passivation of silicon, which is a particular instantiation of surface passivation by quantum exclusion that is illustrative of the principles, methods, and advantages of the inventive technology.

Nature of Delta-Doping as Taught by JPL

To introduce multilayer passivation of silicon, and to provide a basis for comparison with the prior art, we begin with a description of the nature of surface passivation by delta-doping as taught by JPL, as well as the problems recently identified with this technology. As applied to optical detectors, the essential principle of delta-doping is to replace the thick p+ substrate of a front-illuminated detector with an ultrathin p+ layer that reproduces (in essence) the electric field and potential barrier formed by the $p^+p$ junction of the original substrate/epilayer interface. Because the ultrathin delta-doped layer is essentially transparent (in a qualified sense), back-illuminated, delta-doped detectors exhibit extremely high quantum efficiency over the entire electromagnetic spectrum accessible to silicon (from soft x-rays through the near infrared). The essence of the problem of back illumination lies with problem of surface passivation and stability; in particular, it is essential that chemical and physical changes to the passivated surface do not affect detector performance.

As described hereinabove, JPL's delta-doping technology is the best surface passivation technology of any in the prior art. JPL's patents and publications teach that the delta-doped layer should be situated approximately 1-2 nm from the Si—$SiO_2$ interface in order to achieve the best performance of back-illuminated silicon detectors. Even though the delta-doped layer taught by JPL is only 2.5 nm thick (equivalent to about 10 atomic monolayers in the silicon crystal), the sheet density of dopant atoms in JPL's delta-doped layers is approximately $2 \times 10^{14}$ cm$^{-2}$. A dopant density this high should create a highly conductive surface, because the sheet density of dopants is almost two orders of magnitude larger than the surface charge densities normally present in native oxides of silicon.

Low Sheet Densities of Holes in Delta-Doped Surfaces

Recent measurements of surface sheet density (a measure of conductivity) of delta-doped surfaces at JPL show that a near-surface delta-doped layer exhibits sheet densities two orders of magnitude lower than expected, whereas the sheet density of deep delta-doped layers is within the expected range (see Table 1). Profiles of the surface by secondary ion mass spectrometry (SIMS) indicate the delta-doped surface contains a sheet density of dopant atoms close to the design value of $2 \times 10^{14}$ cm$^{-2}$. This presents a problem for at least two reasons: first, because conductivity is an essential function of the substrate that should be reproduced by the surface passivation layer; and second, the low surface conductivity indicates that the delta-doped is less robust than previously thought. The low sheet density of delta-doped surfaces therefore demonstrates a need for an improved surface passivation technology and provides a basis for evaluating the inventive technology.

Table 1 provides a comparison of delta-doped vs. multilayer-doped surfaces based on sheet number (a measure of surface conductivity. This represents data from MBE-grown layers on ultrahigh purity silicon substrates, in order to ensure that the conductivity measurements accurately reflect the mobile charge created by doping in the surface passivation layer.

TABLE 1

| Technology | Structure | Sheet number ($\times 10^{14}$ cm$^{-2}$) |
|---|---|---|
| Delta-doped surface | Shallow delta-layer | 0.05 |
| | Deep delta-layer* | 0.9 |
| Multilayer doped surface | Two layer multilayer | 1.0 |
| | Four layer multilayer | 4.0 |

*Note that data for the deep delta-layer are presented for comparison purposes only. Delta-layers buried deep under the surface are not suitable for surface passivation of imaging detectors, because too much signal is lost in the surface region.

Dopant Compensation, Chemical Mechanisms, and Models: an Approach to Evaluate Multilayer Doping for Surface Passivation The discrepancy between the sheet densities of holes and dopant atoms described above indicates that proximity to the surface is somehow compensating the delta-doped layer. There are at least two possible reasons for this discrepancy. Either the great majority of dopant atoms in the layer nearest the surface are electrically inactive, or the great majority of holes are being immobilized by the surface. Chemical mechanisms exist that would account for either or both of these possibilities; furthermore, these mechanisms involve hydrogen, which is well-known to be ubiquitous in silicon oxides. Deactivation of surface dopant atoms such as Boron by subsurface hydrogen is well-known in the art. Injection and trapping of holes in surface oxides is also well-known, and is the subject of a relatively large literature. It has recently been determined that immobilization of holes in oxides can be an ionic rather than an electrical process, as the injection of holes into the oxide causes the release of hydrogen from oxygen vacancies, creating both a type of defect known as an E center and also causing the hydrogen to enter into a stable bond with a bridging oxygen atom, thus creating a fixed, positive charge in the oxide. Both mechanisms—deactivation vs. immobilization—are therefore associated with hydrogen on or near the surface. Thus the conductivity data show that improvements over delta-doping are necessary and provide a quantitative basis for comparison with models, while the chemical mechanisms offer a meaningful starting point for modeling the surfaces of delta-doped and multilayer doped silicon. Together, models and data provide a means for comparing the inventive technology with the prior art, and show that multilayer doping provides significant advantages over the prior art.

Modeling the Quantum Mechanical Behavior of Surfaces

Quantum mechanical models of the surface, together with new MBE growths and characterization data, provide new insights into surface passivation by delta-doping, and illuminate some problems with delta-doping and other state-of-the-art passivation technologies. Calculations and experiments on improved MBE-grown structures demonstrate the practical application and advantages achieved by using the concepts of surface passivation by quantum exclusion to design new device structures and methods.

The principles of quantum mechanics and semiconductor band theory are necessary to model the behavior of majority and minority carriers in mesoscale semiconductor structures, thus providing the essential connection between composition, structure, and electrical behavior.

Calculations of near-surface properties of MBE-grown layers are essential to illustrate the concepts and applications of surface passivation by quantum exclusion. In order to connect theory with experiment, several approximations are required. These approximations are essential to making the problem tractable, so that the results of model calculations should be taken as descriptive rather than quantitative predictions. An effort has been made to make use of accepted models and to incorporate as much detail and knowledge of materials as is practical; nevertheless, devices and methods described here are to be evaluated based on characterization and performance data, and do not stand or fall based on accuracy of the models.

Because of the relationship between nanometer-scale doping profiles, the electronic potential of doped semiconductors, and wave properties of electrons and holes at nanometer length scales, a theoretical analysis of MBE-grown passivation layers requires quantum mechanical models to describe the behavior of both electrons and holes in near the Si—SiO$_2$ interface. Here we use self-consistent solutions of the Schröodinger and Poisson equations to model the near-surface band structure; the conduction bands, including the L-point (including the splitting of transverse and longitudinal modes), X-point, and Gamma-point minima, are modeled using the effective mass approximation; for the valence bands, an eight-band k·p model is used to incorporate band-coupling effects.

Multilayer Passivation of Silicon Surfaces

Multilayer doping is implemented by growing multiple delta-doped layers on a silicon surface, in which the separation between adjacent layers is small enough to allow quantum mechanical coupling between layers. Quantum mechanical coupling maintains the high quantum efficiency of delta-doping, while multilayer doping increases the surface conductivity by two orders of magnitude compared to delta-doping and provides greater isolation between the surface and bulk regions. Conductivity measurements of MBE-grown layers demonstrate methods and devices by which the surface conductivity can be increased by two orders of magnitude while achieving, and possibly improving, the isolation of surface from bulk silicon that is necessary for effective surface passivation.

Modeling Multilayer Doping and Comparing with Delta-Doping

For the purposes of modeling, immobilization of holes at the surface will create a surface dipole layer, as charged dopant atoms are physically separated from charge at the surface by the thickness of the silicon cap layer. The dipole layer creates an electric field that tends to confine holes in the semiconductor and electrons at the surface; however, the dipole layer is so narrow that quantum confinement greatly increases the ground state energy of electrons confined at the surface, to the point that most of the states are coupled to conduction band states in the bulk of the detector. In contrast, deactivation of dopant atoms will effectively neutralize them, thus removing them from the model as far as calculations of potential are concerned. Therefore, to span these possibilities, two cases are considered: First, immobilization of charge and the creation of a strong surface dipole, and second, neutralization of dopants and a reduction of the dopant density in the layer closest to the surface.

Division into Regions

Figure 4:
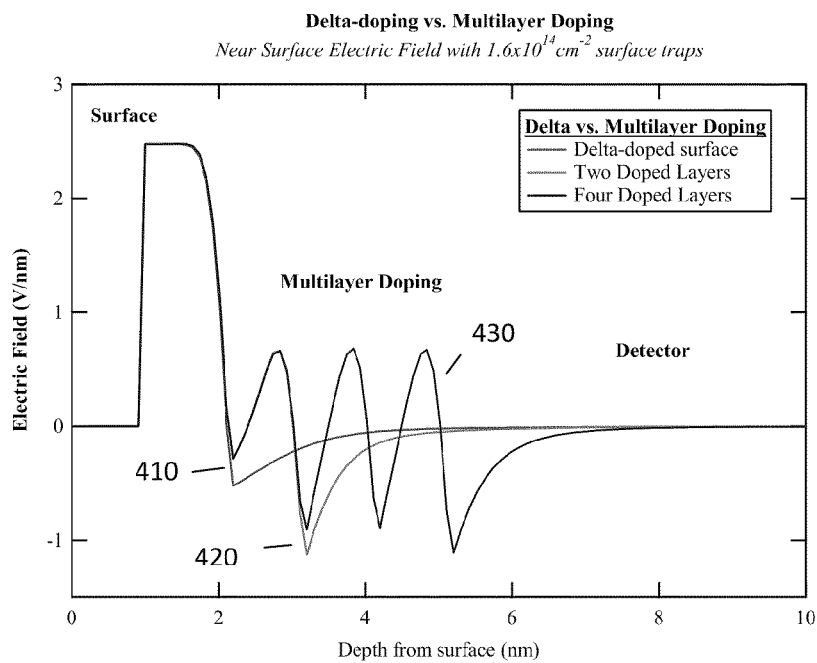
FIG. 4 is a diagram that illustrates electronic potential comparing delta-doping and multilayer doping. The surface dipole and silicon bulk potentials are very similar in delta-doped and multilayer doped surfaces. Multilayer doping creates a wider potential barrier separating the surface from the bulk regions, which creates greater isolation of surface from bulk and greatly increases the surface conductivity. Curve 410 represents calculated data for a single delta doped layer, curve 420 represents calculated data for a multilayer having two doped layers, and curve 430 represents calculated data for a multilayer having four doped layers.
Figure 5:
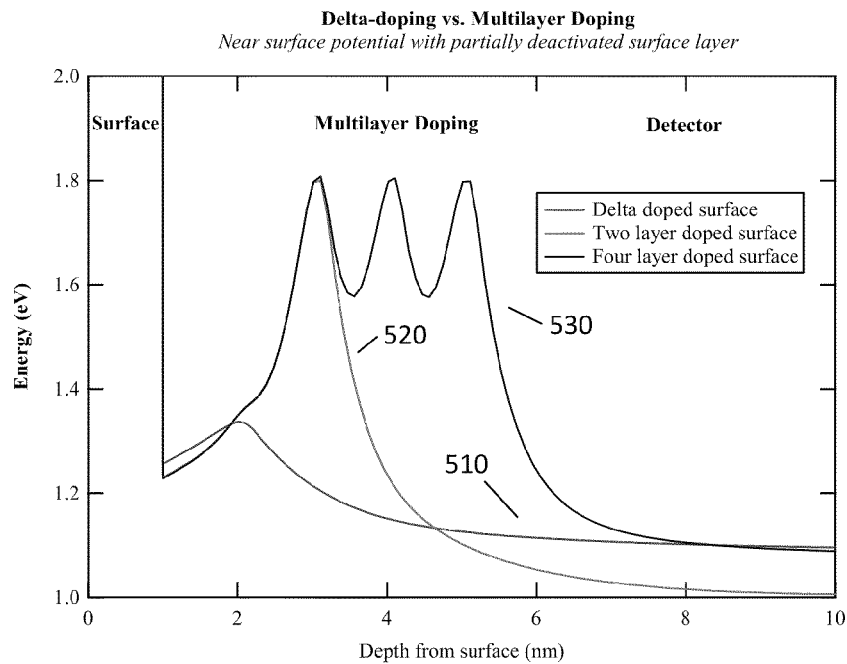
FIG. 5 is a diagram that illustrates the electron states near a surface that is passivated by delta-doping. This plot shows the quantized electron states calculated for the L, X, and Gamma conduction bands. Each state is represented by the probability density as a function of depth, shifted and scaled so that the vertical position reflects the energy of the state. The conduction band edge for the longitudinal L band is also plotted for comparison. Curve 510 represents calculated data for a single delta doped layer, curve 520 represents calculated data for a multilayer having two doped layers, and curve 530 represents calculated data for a multilayer having four doped layers.
Figure 6:
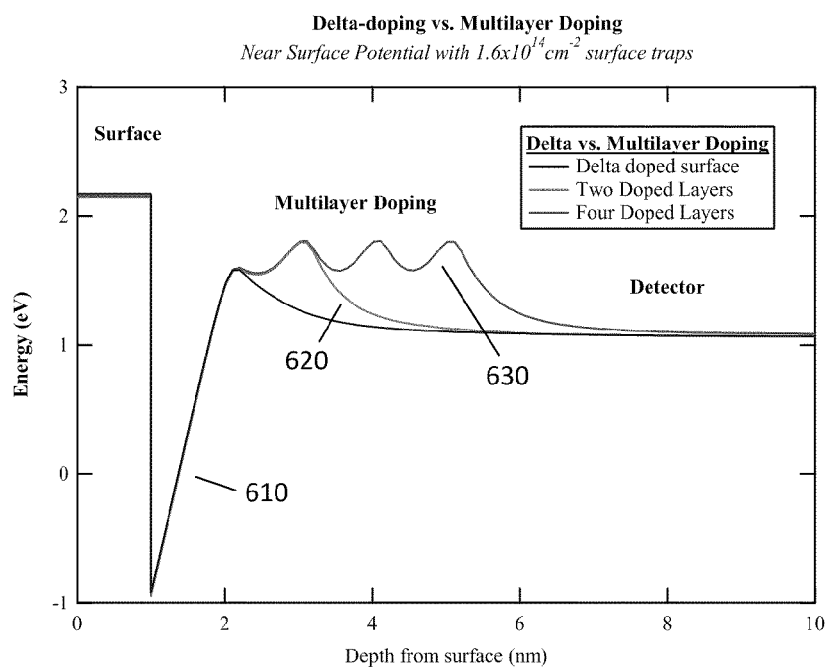
FIG. 6 is a diagram that illustrates the electron states near a surface passivated by a multilayer having two doped layers. In comparison with delta-doped surface (FIG. 5), the increased barrier height provided by multilayer doping results in improved isolation of bulk silicon from the surface, and also creates a few surface resonances (shown in bold). These are electron states that have locally enhanced probability densities near the Si—SiO$_2$ interface. Curve 610 represents calculated data for a single delta doped layer, curve 620 represents calculated data for a multilayer having two doped layers, and curve 630 represents calculated data for a multilayer having four doped layers.
Figure 7:
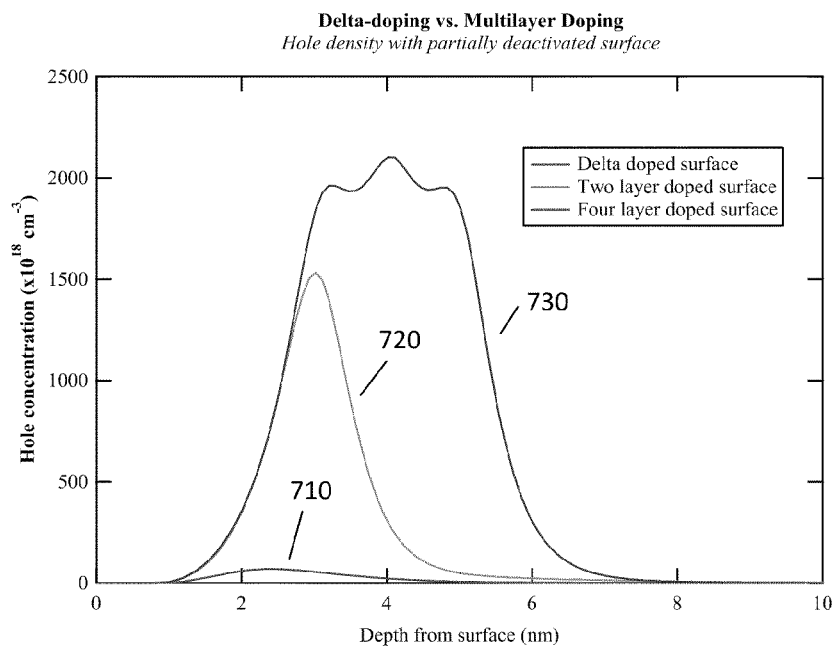
FIG. 7 is a diagram that illustrates the hole density near surfaces passivated by delta-doping and multilayer doping. Consistent with the surface conductivity measurements, multilayer doping dramatically increases the concentration of majority carriers near the surface. Curve 710 represents calculated data for a single delta doped layer, curve 720 represents calculated data for a multilayer having two doped layers, and curve 730 represents calculated data for a multilayer having four doped layers.
Figure 8:
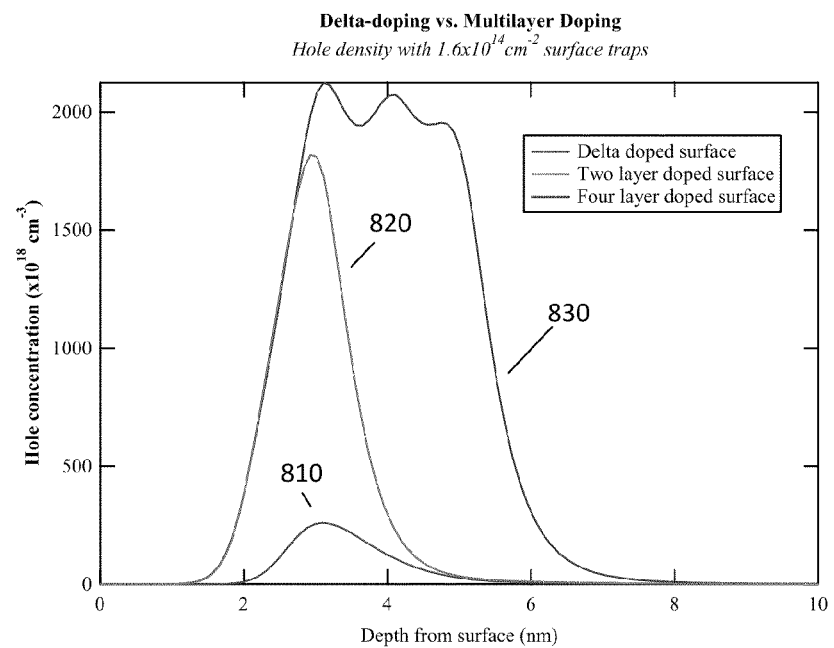
FIG. 8 is a diagram that illustrates the electron states near a surface passivated by a multilayer having four doped layers. In comparison with delta-doped surface (FIG. 5) and the multilayer having two doped layers (FIG. 6), increasing the number of doped layers in the multilayer further improves the isolation of bulk silicon from the surface, and also enhances the localization of the few surface resonances (shown in bold). The lowest energy surface resonances may be considered quasi-bound.
Figure 9:
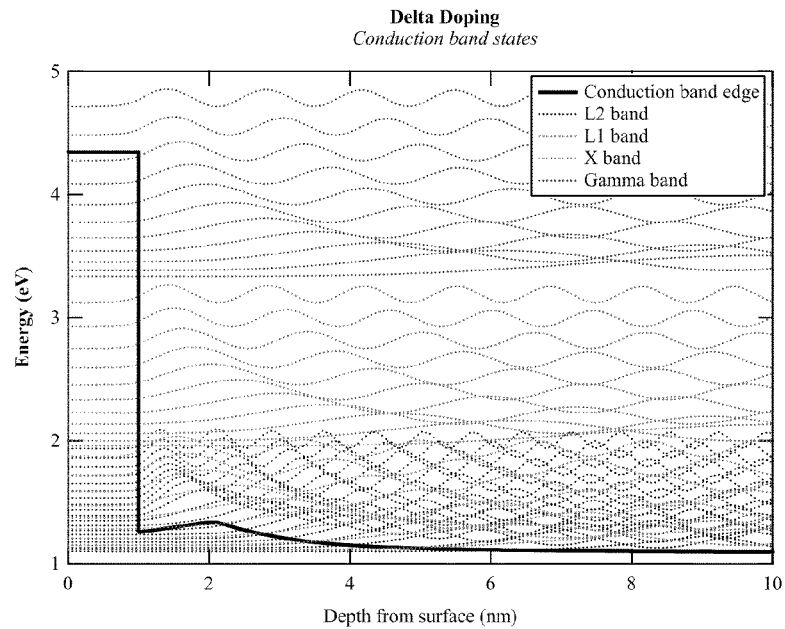
FIG. 9 is a diagram that illustrates delta-doping with surface deactivation: Quantized electron states show reduced tunneling barrier separating surface from bulk; however, there are no surface confined states that could trap hot carriers.
Figure 10:
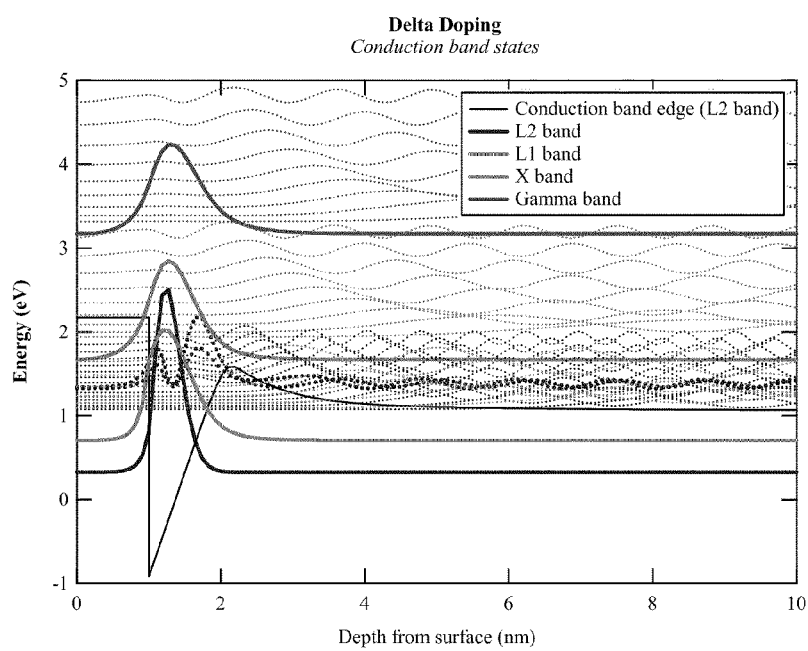
FIG. 10 is a diagram that illustrates delta-doping with surface trapping of holes: Quantized electron states show a strong tunnel barrier separating surface from bulk; a deep surface well produces a small number of surface confined states that could trap hot carriers, but many more unconfined states.
Figure 11:
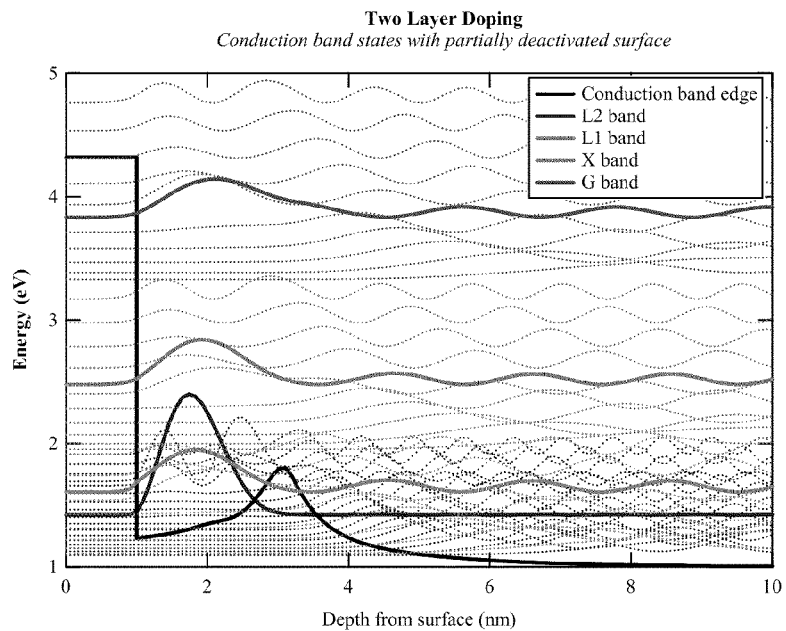
FIG. 11 is a diagram that illustrates a two layer multilayer with surface deactivation. In comparison with delta-doped surface (FIG. 9), the increased barrier height provided by multilayer doping results in improved isolation of bulk silicon from the surface, and also creates a few surface resonances (shown in bold).
Figure 12:
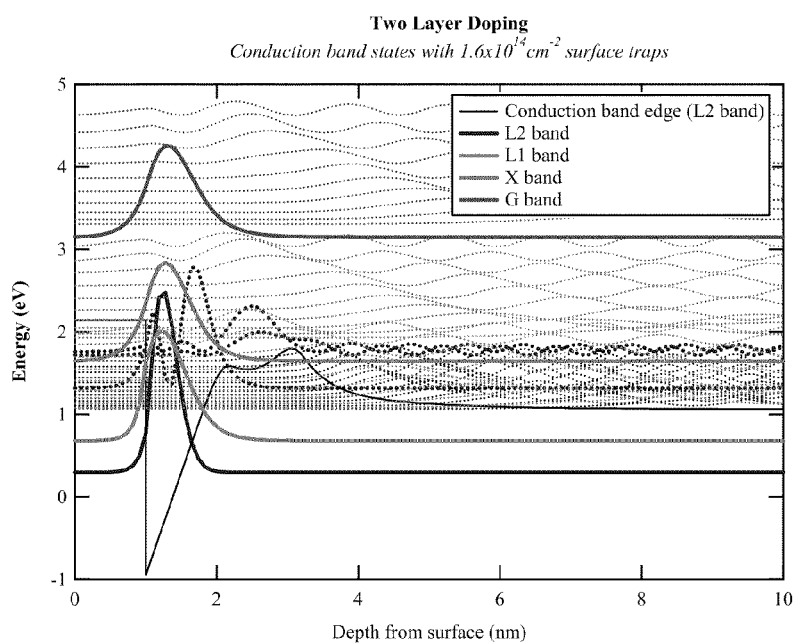
FIG. 12 is a diagram that illustrates a two layer multilayer with surface trapping of holes. In comparison with a delta-doped surface (FIG. 10), the two layer multilayer provides a stronger tunnel barrier isolating surface from bulk; however, in this case, the main advantage of multilayer doping lies in the two order of magnitude increase in hole sheet density near the surface.
Figure 13:
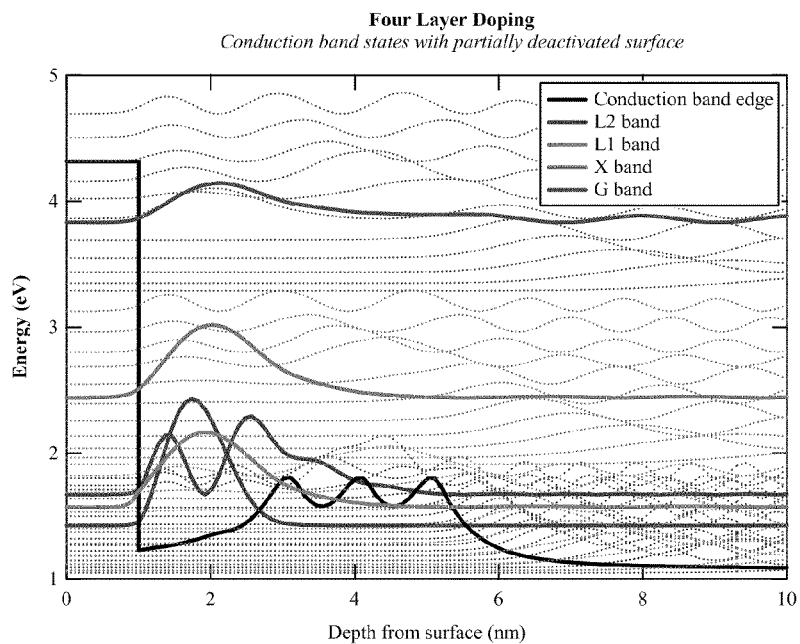
FIG. 13 is a diagram that illustrates electron states near a surface passivated by a multilayer having four doped layers. In comparison with delta-doped surface (FIG. 9) and the multilayer having two doped layers (FIG. 11), increasing the number of doped layers in the multilayer further improves the isolation of bulk silicon from the surface, and also enhances the localization of the few surface resonances (shown in bold). The lowest energy surface resonances may be considered quasi-bound.
Figure 14:
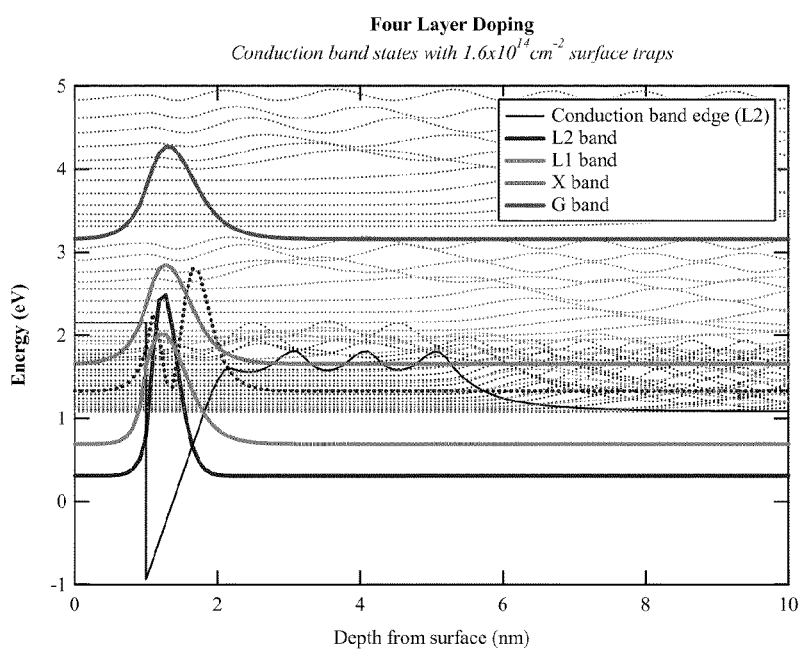
FIG. 14 is a diagram that illustrates a multilayer having two doped layers with surface trapping of holes: In comparison with a delta-doped surface (FIG. 10), the multilayer having four doped layers provides a stronger tunnel barrier isolating surface from bulk; however, in this case, the main advantage of multilayer doping lies in the two order of magnitude increase in hole sheet density near the surface.
Figure 15:
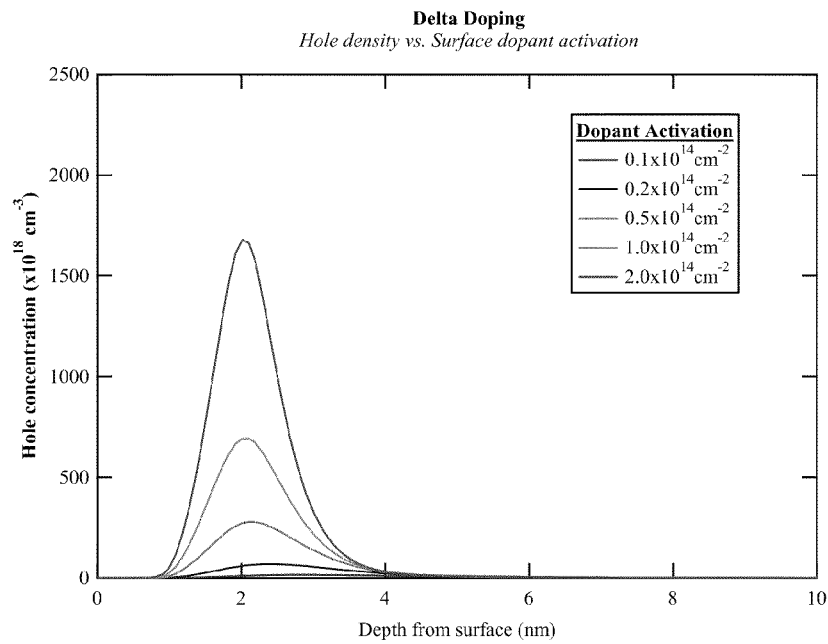
FIG. 15 is a diagram that illustrates delta doping robustness against dopant deactivation with varying levels of deactivation. The calculation assumes a density of surface traps of $5 \times 10^{12}$ cm$^{-2}$.
Figure 16:
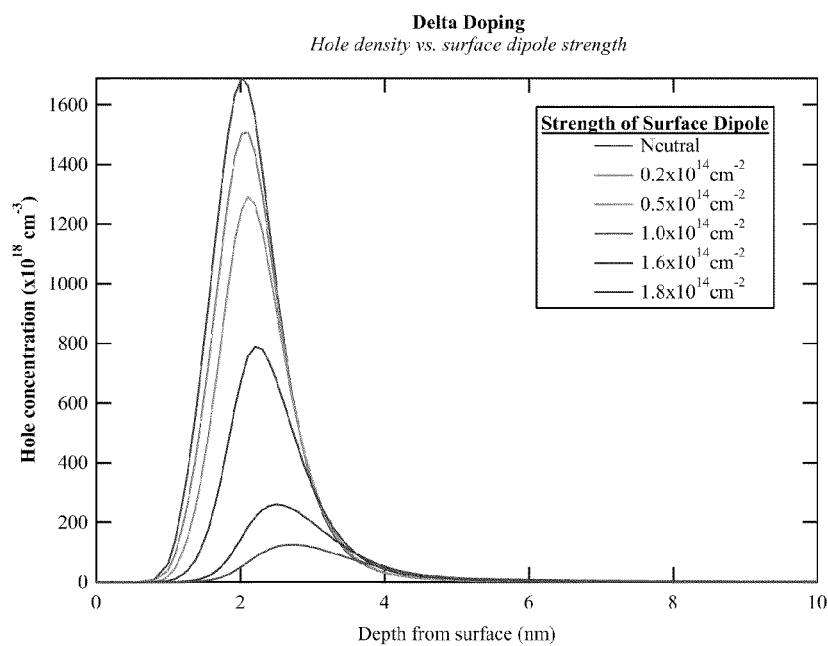
FIG. 16 is a diagram that illustrates delta doping robustness against surface charge with full activation, but varying densities of surface traps.
Figure 17:
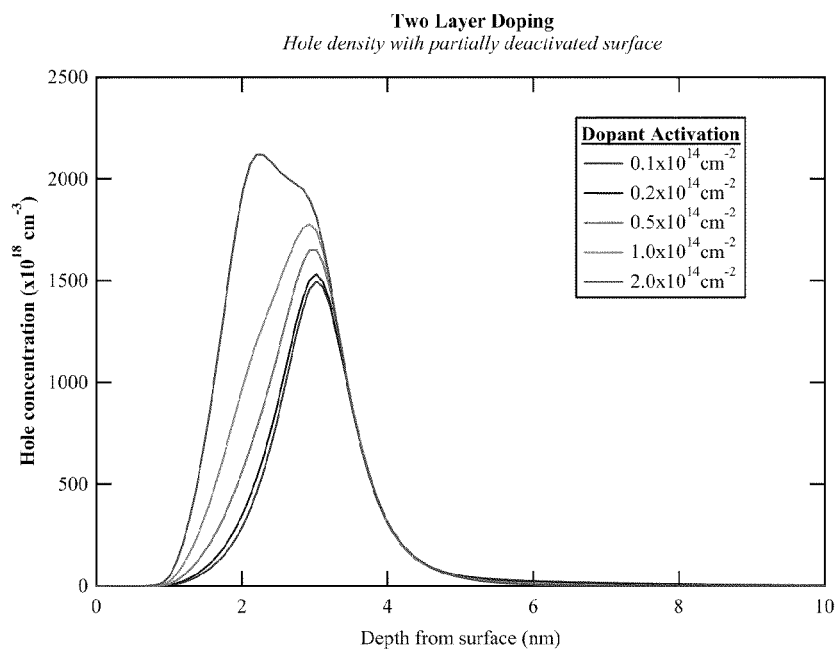
FIG. 17 is a diagram that illustrates the robustness of a multilayer with two doped layers against dopant deactivation with varying levels of deactivation. The calculation assumes a density of surface traps of $5 \times 10^{12}$ cm$^{-2}$.
Figure 18:
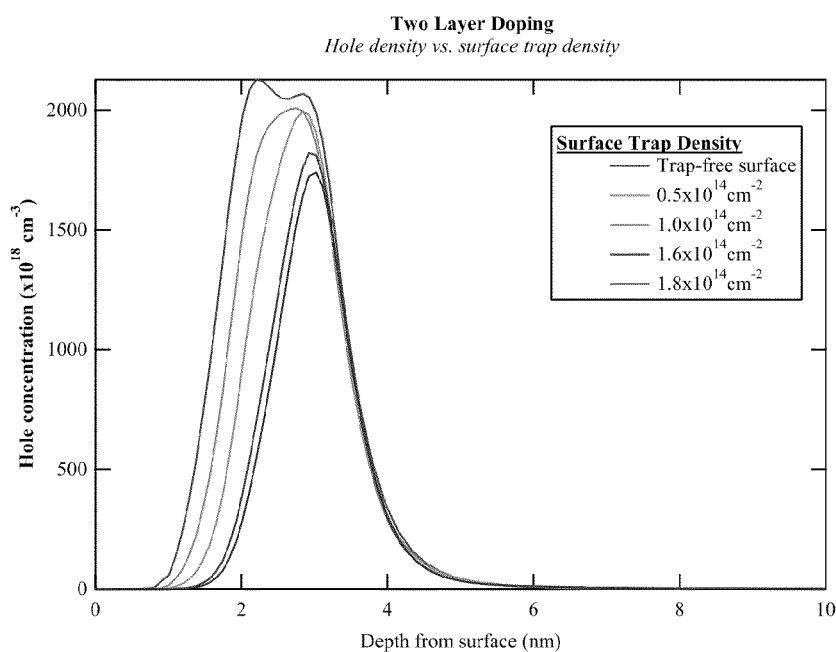
FIG. 18 is a diagram that illustrates the robustness of a multilayer with two doped layers against surface charge with full activation, but varying densities of surface traps.
Figure 19:
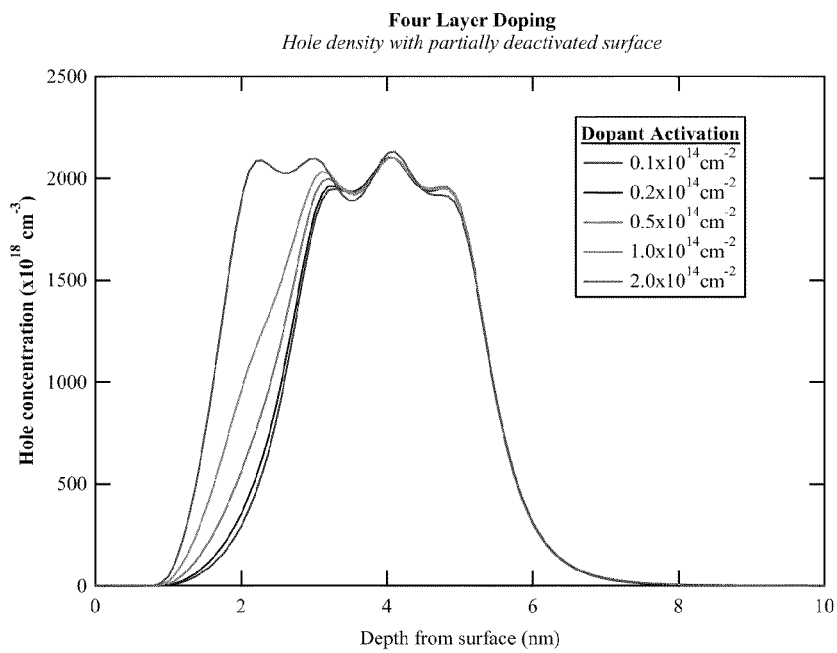
FIG. 19 is a diagram that illustrates the robustness of a multilayer with four doped layers against dopant deactivation with varying levels of deactivation. The calculation assumes a density of surface traps of $5 \times 10^{12}$ cm$^{-2}$.
Figure 20:
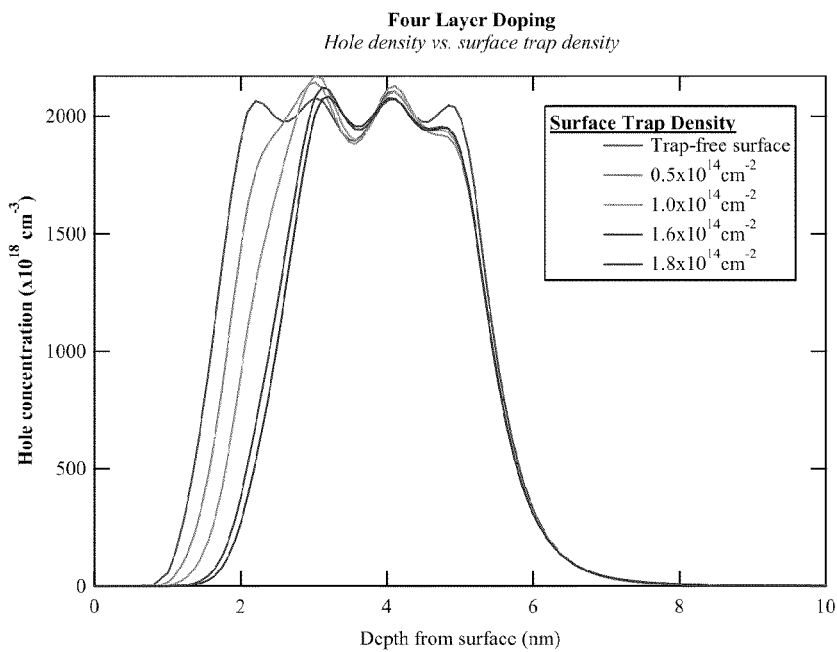
FIG. 20 is a diagram that illustrates the robustness of a multilayer with four doped layers against surface charge with full activation, but varying densities of surface traps.

The plots show electric field and potential energy (FIG. 4, FIG. 5 and FIG. 6), hole concentration (FIG. 7 and FIG. 8), electron states (FIG. 9 through FIG. 14), and robustness (FIG. 15 through FIG. 20). The plots illustrate the principles of the inventive technology by separating the multilayer-doped surface into three regions, as follows:

Chemical Interface

A surface region is bounded by the Si—SiO$_2$ interface on one side, and the first delta-doped layer on the other. The chemistry of the Si—SiO$_2$ interface dominates this region. The first doped layer should be close to the Si—SiO$_2$ interface in order that this region be subject to quantum confinement effects in calculated energy states of minority carriers. Quantum confinement in this region helps to minimize trapping of minority carriers. Trapping of holes in the oxide creates fixed positive charge and a surface dipole region between the Si—SiO$_2$ interface and the first doped layer. Charge separation in the dipole region creates a strong surface field. Hydrogen generated in the surface can deactivate dopants in the doped layer nearest the surface.

Multilayer

The multilayer region is a new region. Whereas delta-doping represents an abrupt boundary between the chemical and physical interfaces, the multilayer region interposes a region of finite width, with properties that can be controlled by design. In one embodiment, by growing several delta-layers instead of one, a "multilayer" of coupled quantum wells is created. The separation between layers preferably is narrow, so that the quantum wells are coupled. If the separation between layers is too large carriers could get trapped in the individual wells, and the quantum efficiency would be low. The dopant sheet densities preferably are high in order to get good isolation between the bulk and the wafer surface. A high barrier provides better suppression of tunneling, and is more robust against dynamic surface charging, damage and other environmental effects. High dopant sheet densities also provide high electrical conductivity, which is lacking in delta-doped surfaces.

Physical Interface

This interface defines the electronic surface of the detector; it is the beginning of the original detector material that existed prior to MBE growth, and is comprised of high purity silicon. This is where photogenerated minority carriers need to go in order to be detected, and once they are there, the multilayer region needs to provide an excellent tunnel barrier to prevent their coming back. The electric field extending into this region from the multilayer region and the height and width of the potential barrier created by the multilayer region are key parameters in determining the effectiveness of surface passivation. The electric field and potential barrier created by delta-doping are much lower than expected, based on inferences from the conductivity data. Multilayer doping is far superior to delta-doping and to any other prior art by the various criteria illustrated by the models and confirmed by the data.

Fabrication Methods of Implement Multilayer Passivation

Because multilayer doping requires the growth of a plurality of doped layers on the back surface of a silicon detector, the methods previously developed for thinning and delta-doping silicon detectors can be used to prepare the surface and grow the first doped layer. Subsequent doped layers are formed by an iterative growth process, in order to form the desired number of doped layers in the multilayer region. While the multilayers formed by this method are generally taken to be periodic, the inventive technology of multilayer doping for detector passivation does not require that all layers be formed identically.

In one preferred embodiment, the preferred method for multilayer doping includes the following process steps. Note that some steps may be added, altered, eliminated, or performed in a different sequence, depending on specific requirements for different detector designs.

1. Supporting the detector prior to thinning the wafer by a frame-thinning process in which thinning leaves a thick frame to support the thinned region, or by bonding the detector to a mechanical support prior to thinning in order to thin the entire device.
2. Cleaning the surface to be thinned, for example, using a standard cleaning process for silicon wafers, such as the RCA cleaning process.
3. Thinning the detector, for example, by a series of steps including chemical-mechanical polishing, chemical etching with a heated KOH solution, chemical etching with a mixture of hydrofluoric and acetic acids, and etching with a solution of $KMnO_4$.
4. Cleaning the back surface of the thinned detector, for example, by another RCA cleaning step, followed by a UV ozone cleaning process.
5. Hydrogen passivation of the surface, for example, by placing the detector on a spinner in a nitrogen environment, and exposing the surface to a sequence of chemicals while spinning including ethanol, an HF:ethanol mixture, and ethanol again.
6. Loading the device into a vacuum chamber and pumping to ultrahigh vacuum pressures.
7. Transferring the device under vacuum into the MBE growth chamber.
8. Annealing the device at low temperature to remove volatile chemicals from the surface, for example, by heating to 150° C. for at least 10 minutes.
9. Heating to a temperature of at least 380° C. and not more than 450° C.
10. Growth of a silicon layer as a buffer layer to produce an atomically clean silicon surface.
11. Stop silicon growth.
12. Optionally cool the device to a lower temperature, for example, to a temperature between 250° C. and 300° C. for growth of n-type multilayers.
13. Perform iterative growth of a plurality of delta-layers: For each delta-layer in the multilayer, deposit dopant atoms until the desired dopant density is reached, stop the flux of dopant atoms, and grow a desired thickness of silicon over the delta-layer. For example, a dopant density of $2 \times 10^{14}$ $cm^{-2}$ and a silicon layer thickness between 1 and 2 nm may be used for each delta-layer. It is not required that each layer be identical to the previous layer.
14. Cool the device gradually, and remove from the MBE chamber.
15. Optional steps for oxide formation and antireflection coating, as necessary for specific applications.
16. At this point the passivation by multilayer doping is complete, and additional steps for packaging may be performed as needed.

Figure 21:
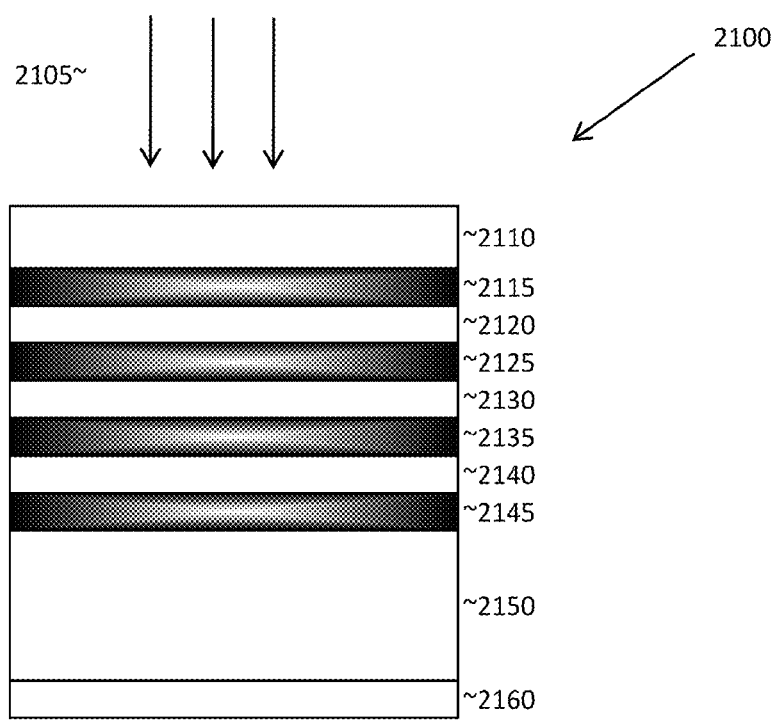
FIG. 21 is a schematic, not to scale, diagram that illustrates a cross section of a wafer having multilayer doping according to principles of the invention.

FIG. 21 is a schematic, not to scale, diagram that illustrates a cross section of a wafer 2100 having multilayer doping according to principles of the invention. In this example, a silicon semiconductor wafer is described, having deliberately provided semiconductor devices thereon. In FIG. 21, semiconductor devices (such as a CCD array in one embodiment) are provided on the free surface of the layer 2160 of the wafer shown at the bottom of FIG. 21. Illumination represented by arrows 2105 is expected to impinge on the wafer from the back surface side (opposite to the surface where the semiconductor devices are provided). Layer 2150 of the wafer represents the remaining bulk material with a surface present after an optional thinning process is applied to the back side of wafer 2100. Layers 2115, 2125, 2135, and 2145 and layers 2120, 2130 and 2140 are grown on the thinned wafer. In the example illustrated, layers 2115, 2125, 2135 and 2145, presented in partially darkened fill, represent four doped layers that include a density of a deliberately added dopant species (such as a p-type dopant such as boron, or an n-type dopant such as phosphorus or antimony). The wafer 2100 need not have exactly four doped layers, but in general a plurality M of doped layers, where M is an integer greater than 1. The dopant sheet densities in the M doped layers need not be the same, but in principle can be selected to be the same sheet densities or to be different sheet densities. Interleaved between layers 2115, 2125, 2135 and 2145 are M−1 (here with M=4, M−1=3) layers 2120, 2130 and 2140 that are not deliberately doped (also referred to as "undoped layers"), for example, layers that are substantially silicon having no deliberately added dopant. Structures with M=2, M=3 and M=4 have been demonstrated. Layer 2110 is a final semiconductor layer of the wafer provided by growth after all of layers 2115 through 2145 are grown, so that any necessary electrical contacts or optical antireflection layers can be provided on the back surface of wafer 2100. Layer 2100 may be doped as desired or as may be convenient. In general, the plurality of M doped layers 2115, 2125, 2135 and 2145 can be as thin as a single layer of silicon (approximately 2.5 Angstroms) and can be doped at sheet densities up to approximately $2 \times 10^{14}$ $cm^{-2}$ dopant atoms. One way to measure dopant density is sheet density, which is measured in dopant atoms per square cm. The M−1 layers 2120, 2130 and 2140 that are not deliberately doped can have thicknesses in the range of 5 Angstroms to 40 Angstroms, and are preferably grown with thicknesses in the range of 10 Angstroms to 30 Angstroms.

Because some crystal growth methods are kinetically controlled and are not processes that attain a thermodynamic equilibrium, it is expected that it may be possible in a different (second) embodiment to grow the plurality M of doped layers without providing M−1 interleaved undoped layers between adjacent doped layers. This might be accomplished, for example, by allowing a first flux of dopant to impinge the growth surface for a first duration of time (thereby providing less than a complete monolayer of dopant), allowing a flux of silicon to impinge the growth surface for a second duration of time (thereby completing a crystalline monolayer), and then growing another monolayer by using a second dopant flux and a second silicon flux for additional durations of time, respectively. By changing the flux and the time of impingement, one may expect to grow a sequence of layers having a series of desired dopant sheet densities.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A silicon device, comprising:
a silicon wafer bounded by a first surface and a second opposite said first surface, said silicon wafer having a device fabricated on one of said first surface and said second surface;
said silicon wafer having a doping profile situated adjacent at least one of said first surface and said second surface, said doping profile having a plurality M of doped layers; each of plurality M of doped layers having a thickness of less than 10 Angstroms, and a dopant sheet density at least $10^{14}$ cm$^{-2}$, where M is an integer greater than 1; said plurality M of doped layers separated from each other by M−1 interleaved layers of silicon, at least one of said M−1 interleaved layers of silicon having a thickness in the range of 10 Angstroms to 30 Angstroms;
said silicon wafer having at least one of said first surface and said second surface electronically passivated irrespective of a density of defects present on said respective one of first surface and said second surface.

2. The silicon device of claim 1, wherein M is at least 3, and said plurality M of doped layers are separated by M−1 interleaved layers of silicon, at least two of said M−1 interleaved layers of silicon having substantially equal thicknesses.

3. The silicon device of claim 1, wherein M is at least 3, and said plurality M of doped layers are separated by M−1 interleaved layers of silicon, at least two of said M−1 interleaved layers of silicon having unequal thicknesses.

4. The silicon device of claim 1, wherein at least one of said M−1 interleaved layers of silicon has a dopant sheet density of less than $10^{13}$ cm$^{-2}$.

5. The silicon device of claim 1, wherein a dopant gradient of at least one decade per nm exists between one of said plurality M of doped layers and an adjacent one of said M−1 interleaved layers of silicon.

6. A silicon device, comprising:
a silicon wafer bounded by a first surface and a second opposite said first surface, said silicon wafer having a device fabricated on one of said first surface and said second surface;
said silicon wafer having a doping profile situated adjacent at least one of said first surface and said second surface, said doping profile having a plurality M of doped layers; each of plurality M of doped layers having a thickness of less than 40 Angstroms, a dopant sheet density at least $10^{14}$ cm$^{-2}$ and a dopant gradient of at least one decade per nm, where M is an integer greater than 1;
said silicon wafer having at least one of said first surface and said second surface electronically passivated irrespective of a density of defects present on said respective one of first surface and said second surface.

* * * * *